United States Patent [19]
Koukoutsis et al.

[11] Patent Number: 5,265,217
[45] Date of Patent: Nov. 23, 1993

[54] OPTIMAL PARAMETRIC SIGNAL PROCESSOR FOR LEAST SQUARE FINITE IMPULSE RESPONSE FILTERING

[75] Inventors: Elias Koukoutsis, Athens; Christos Halkias, Psyhiko; George Carayannis, Athens, all of Greece; Dimitris Manolakis, Chestnut Hill, Mass.

[73] Assignee: Adler Research Associates, Union, N.J.

[21] Appl. No.: 879,712

[22] Filed: May 6, 1992

Related U.S. Application Data

[63] Continuation of Ser. No. 443,049, Nov. 27, 1989, abandoned, which is a continuation of Ser. No. 300,709, Jan. 23, 1989, abandoned, which is a continuation of Ser. No. 21,256, Mar. 3, 1987, abandoned.

[51] Int. Cl.$^5$ .............................. G01L 9/00
[52] U.S. Cl. .................................. 395/2
[58] Field of Search ................ 381/29–32, 381/36–51; 395/2; 364/724.01, 724.15, 728.03, 728.07

[56] References Cited

U.S. PATENT DOCUMENTS

| | | | |
|---|---|---|---|
| 3,662,115 | 5/1972 | Saito | 381/51 |
| 4,340,781 | 7/1982 | Ichikawa et al. | 381/41 |
| 4,378,469 | 3/1983 | Fette | 179/15 A |
| 4,389,540 | 6/1983 | Nakamura et al. | 381/41 |
| 4,401,855 | 8/1983 | Broderson et al. | 381/41 |
| 4,544,919 | 10/1985 | Gerson | 364/724 |
| 4,641,238 | 2/1987 | Kneib | 364/200 |
| 4,740,906 | 9/1988 | Renner et al. | 364/724 |
| 4,750,190 | 6/1988 | Moreau et al. | 375/27 |

OTHER PUBLICATIONS

N. Levinson, "The Wiener RMS (Root-Mean-Square) Error Criterion in Filter Design and Prediction", J. Math Phys., vol. 25, pp. 261–278, Jan. 1947.

J. Durbin, "The Fitting of Time Series Models", Rev. Int. Statist. Inst., vol. 28, pp. 233–244, 1960.

H. Lev-Ari and T. Kailath, "Schur and Levinson Algorithms for Non-Stationary Processes", IEEE International Conference on Acoustics, Speech and Signal Processing, 1981, pp. 860–864.

Le Roux and Gueguen, "A Fixed Point Computation of Partial Correlation, Coefficients", IEEE Transactions on acoustics, Speech, and Signal Processing, Jun. 1977, pp. 257–259.

Kung and Hu, "A Highly Concurrent algorithm and Pipelined Architecture for Solving Toeplitz Systems", IEEE Transactions on Acoustics, Speech and Signal Processing, vol. ASSP-31, No. 1, Feb. 1983, pp. 66–76.

G. Carayannis et al., "A New Look on the Parallel Implementation of the Schur Algorithm for the Solution of Toeplitz Equations", IEEE International Conference on Acoustics, Speech and Signal Processing, Mar. 26–29, 1985.

G. Caraynnis et al., "Fast Recursive Algorithms for a Class of Linear Equations", IEEE Transactions on Acoustics, Speech and Signal Processing, vol. ASSP-30, No. 2, Apr. 1982, pp. 227–239.

*Primary Examiner*—Michael R. Fleming
*Assistant Examiner*—Michelle Doerrler
*Attorney, Agent, or Firm*—Davis Hoxie Faithfull & Hapgood

[57] ABSTRACT

A signal processor, which receives autocorrelation and cross-correlation coefficients of a system under study, provides predictor and filter coefficients of the system in an optimal manner, and allows the use of any number of available parallel processing units. The signal processor may be implemented in a fully parallel or fully sequential manner, or in a "parallel-partitioned" implementation.

22 Claims, 9 Drawing Sheets $$T_i^m = T_i^{m-1} + k_m^c \mathcal{J}_{m-i}^{m-1}$$

LBBC

LLBC

OPTIMAL PARAMETRIC SIGNAL PROCESSOR FOR LEAST SQUARE FINITE IMPULSE RESPONSE FILTERING

This is a continuation of copending application Ser. No. 07/443,049 abandoned filed on Nov. 27, 1989, abandoned which is a continuation of copending application Ser. No. 07/300,709 abandoned filed on Jan. 23, 1989, which is a continuation of co-pending application Ser. No. 07/021,256, abandoned, filed on Mar. 3, 1987

CROSS-REFERENCE TO RELATED APPLICATIONS

The present application is related to U.S. patent applications Ser. No. 837,260 abandoned, by Carayannis et al., filed Mar. 7, 1986, and entitled OPTIMAL PARAMETRIC SIGNAL PROCESSOR, and Ser. No. 904,382abandoned, by Carayannis et al., filed Sep. 4, 1986, and entitled OPTIMAL PARAMETRIC SIGNAL PROCESSOR WITH LATTICE BASIC CELL, the entire disclosures of which are hereby incorporated by reference thereto.

FIELD OF THE INVENTION

The present invention relates to the field of signal processing, and in particular, parametric signal processing.

BACKGROUND OF THE INVENTION

Parametric signal processing is used in many areas, such as speech and image analysis, synthesis and recognition, neurophysics, geophysics, array processing, computerized tomography, communications and astronomy, to name but a few.

One example of signal processing of particular importance is the linear prediction technique, which is used for speech analysis, synthesis and recognition, and for the processing of seismic signals, to enable the reconstruction of geophysical substrata. The linear prediction technique employs a specialized autocorrelation function.

Another form of signal processing which finds a multitude of applications, is the determination of an optimal (in the least square sense) finite impulse response (FIR) filter. A signal processor employing such a technique works with the autocorrelation of the filter input signal and the cross-correlation between the input and the desired response signal, and may be used in many of the above-mentioned applications.

Still another form of signal processing of particular importance is known in the art as "L-step ahead" prediction and filtering, for solving the "optimum lag" problem. This technique is especially useful in designing spiking and shaping filters. Signal processors which perform this function employ a specialized autocorrelation function which also takes into account a time lag associated with the system.

Generally, as the order of the system under investigation increases, the complexity of the signal processing necessary to provide useful information also increases. For example, using the general Gaussian elimination procedure, a system of order p can be processed in "$O(p^3)$" steps, indicating the number of steps as being "on the order of" $p^3$, i.e., a function of p cubed. Thus, it will be appreciated that a system having order of $p=100$ requires on the order of one million processing steps to process the signal, a limitation of readily apparent significance, especially where real time processing is required.

Signal processing techniques have been developed which have reduced the number of operations required to process a signal. One such method has been based on a technique developed by N. Levinson, which requires $O(p^2)$ sequential operations to process the signal. In particular, the "Levinson technique" requires $O(2 \cdot p^2)$ sequential operations in order to process the signal. An improved version of this technique, known as the "Levinson-Durbin" technique requires $O(1 \cdot p^2)$ sequential operations to process the signal. Neither of these schemes is suitable for parallel implementation. On the general subject of the Levinson and Levinson-Durbin techniques, see N. Levinson, "The Wiener RMS (Root-Mean-Square) Error Criterion in Filter Design and Prediction", *J. Math Phys.*, Vol. 25, pages 261–278, Jan. 1947; and J. Durbin, "The Filtering of Time Series Models", *Rev. Int. Statist. Inst.*, Vol. 28, pages 233–244, 1960.

Although they represent an order of magnitude improvement over the Gaussian elimination technique, the Levinson and Levinson-Durbin techniques are too slow for many complex systems where real time processing is required.

Another way of implementing the main recursion of the Levinson-Durbin technique, for the computation of what is widely known as "lattice coefficients", was developed by Schur in 1917, in order to establish a system stability criterion. See I. Schur, "Uber Potenzreihen Die In Innern Des Einheiskreises Beschrankt Sind", *J. Reine Angewandte Mathematik*, Vol. 147, 1917, pages 205–232. Lev-Ari and Kailath, of Standford University, have developed a different approach, based on the Schur and Levinson techniques, which provides a triangular "ladder" structure for signal processing. The Lev-Ari and Kailath technique uses the signal, per se, as the input to the processor, rather than autocorrelation coefficients, and it is used in the signal modelling context. See H. Lev-Ari and T. Kailath, "Schur and Levinson Algorithms for Non-Stationary Processes", *IEEE International Conference on Acoustics, Speech and Signal Processing*, 1981, pages 860–864.

In another modification to the Schur technique, Le Roux and C. Gueguen re-derived the Schur algorithm, giving emphasis to the finite word length implementation, using fixed point arithmetics. See Le Roux and Gueguen, "A Fixed Point Computation of Partial Correlation, Coefficients", *IEEE Transactions on Acoustics, Speech, and Signal Processing*, June 1977, pages 257–259.

Finally, Kung and Hu, have developed a parallel scheme, based on the Schur technique, which uses a plurality of parallel processors, to process a signal, having order p, in O(p) operations, a significant improvement compared to the Levinson-Durbin technique. See Kung and Hu, "A Highly Concurrent Algorithm and Pipelined Architecture for Solving Toeplitz Systems", *IEEE Transactions on Acoustics, Speech and Signal Processing*, Vol. ASSP-31, No. 1, February 1983, pp. 66–76. However, the application of the Kung and Hu technique is severely limited insofar as it requires that the number of processors be equal to the order of the system to be solved. Thus, the Kung and Hu technique cannot process a signal produced by a system having an order greater than the number of parallel processors. System complexity is therefore a major limiting factor in using the Kung and Hu technique, insofar as many complex systems may have orders much higher than the number of parallel processors currently available in modern VLSI or other technology.

OBJECTS AND SUMMARY OF THE INVENTION

It is therefore an object of the present invention to overcome the difficulties associated with prior art signal processors and methods.

It is another object of the present invention to provide an optimal parametric signal processor and processing method for least squares finite impulse response (LS-FIR) filtering.

It is another object of the present invention to provide a signal processor and processing method, for LS-FIR filtering, which can be implemented using (i) a single processing unit to process a signal in a fully sequential manner, (ii) a plurality of processing units to process a signal in fully parallel manner, or (iii) a lesser plurality of processing units to process a signal in a "partitioned parallel" manner.

It is another object of the present invention to provide an LS-FIR filter which also yields as a by-product a linear predictor.

It is another object of the present invention to provide an LS-FIR signal processing structure having minimal hardware complexity.

In accordance with a first aspect of the invention, a signal processor receives autocorrelation and cross-correlation coefficients from a system, and provides lattice predictor and filter coefficients of that system. The signal processor includes means for receiving a plurality of the autocorrelation and cross-correlation coefficients, means for multiplying a first pair of adjacent autocorrelation coefficients by a first lattice coefficient, resulting in first and second products, and for adding (i) one of the first pair of autocorrelation coefficients to the first product, and (ii) the other of the first pair of coefficients to the second product, to yield a first pair of intermediate values, during a first time interval. Additionally, means are provided for multiplying one of the first pair of autocorrelation coefficients by a second lattice coefficient, resulting in a third product, and for adding a first cross-correlation coefficient to the third product to yield a third first intermediate value, during the first time interval. Divider circuitry is also provided for forming the quotient of a selected pair of autocorrelation coefficients to produce the first lattice coefficient and for forming the quotient of a selected autocorrelation coefficient and a selected cross-correlation coefficient to produce the second lattice coefficient.

Further, the signal processor may include means for multiplying a second pair of adjacent autocorrelation coefficients by the first lattice coefficient resulting in respective fourth and fifth products, and for adding (i) one of the second pair of autocorrelation coefficients to the fourth product, and (ii) the other of the second pair of autocorrelation coefficients to the fifth product to yield a second pair of first intermediate values, during a second time interval. Also operative during the second time interval are means for multiplying one of the second pair of autocorrelation coefficients by the second lattice coefficient, resulting in a sixth product, and for adding a second cross-correlation coefficient to the sixth product to yield a sixth first intermediate value. The divider circuitry functions to form a pair of quotients of selected ones of the first intermediate variables, to provide third and fourth lattice coefficients, corresponding to the desired lattice predictor and filter coefficients.

Operative during a third time interval are means for multiplying a selected two of the first intermediate values in the first and second pairs of intermediate values, by the third lattice coefficient, resulting in respective seventh and eighth products, and for adding (i) a first of the selected two intermediate values to the seventh product, and (ii) a second of the selected two intermediate values to the eighth product, to yield a pair of second intermediate values. Also operative during the third time interval are means for multiplying one of the first intermediate values by the fourth lattice coefficient to produce a ninth product, and for adding one of the third and sixth first intermediate values to the ninth product to yield a third second intermediate value.

The signal processor may either comprise a plurality of parallel processing units, in which case the first and second time intervals occur substantially simultaneously, and proceed the third time interval, or may comprise a single processing unit, in which case the first will precede the third time interval.

In accordance with another aspect of the invention, a signal processor receives autocorrelation and cross-correlation coefficients from a system, and provides lattice predictor and filter coefficients of that system. The signal processor includes an input device for receiving the autocorrelation and cross-correlation coefficients, and at least two parallel processing units, each of which includes a processor for (i) multiplying a first one of the autocorrelation coefficients by a first lattice coefficient, resulting in a first product, (ii) multiplying a second one of the autocorrelation coefficients by the first lattice coefficient resulting in a second product, and by a second lattice coefficient, resulting in a third product, and (iii) adding the second one of the autocorrelation coefficients to the first product, and the first one of the autocorrelation coefficients to the second product, and a first one of the cross-correlation coefficients to the third product, to yield a trio of first intermediate values.

A divider is also provided for forming a pair of quotients of first intermediate values selected from two of the parallel processing units, to thereby produce the desired lattice predictor and filter coefficients. Further, a storage and retrieval structure is provided for reapplying selected ones of the first intermediate values from at least two of the parallel processing units, and the lattice predictor and filter coefficients, to at least one of the parallel processing units, to produce a trio of second intermediate values in a similar manner.

In accordance with still another aspect of the present invention, a signal processor receives autocorrelation and cross-correlation coefficients from a system, and provides lattice predictor and filter coefficients of that system. The signal processor includes means for receiving a plurality of autocorrelation and cross-correlation coefficients, means for multiplying a first autocorrelation coefficient by a first lattice coefficient, resulting in a first product, and for individually adding a first pair of autocorrelation coefficients, adjacent to the first autocorrelation coefficient, to the first product, to yield a first pair of first intermediate values, and means for multiplying the first autocorrelation coefficient by a second lattice coefficient, resulting in a second product, and for adding a cross-correlation coefficient to the second product to yield a third first intermediate value. A divider is provided for forming a pair of quotients of the first intemediate values, to thereby produce the lattice predictor and filter coefficients.

Many other aspects of the present invention will become apparent to those skilled in the art, the above aspects being merely exemplary.

BRIEF DESCRIPTION OF THE DRAWINGS

The foregoing and other objects, aspects and embodiments of the present invention will be described in more detail below with reference to the following drawing figures, of which.

DETAILED DESCRIPTION OF THE INVENTION

Since the present invention is based on the invention of the applications, Ser. Nos. 837,260, abandoned, and 904,382, abandoned, a description of the relevant parts of those applications, as they relate to the present invention, will be made, with reference to FIGS. 1 and 2, herein.

The Non-Symmetrical Case

Figure 1:
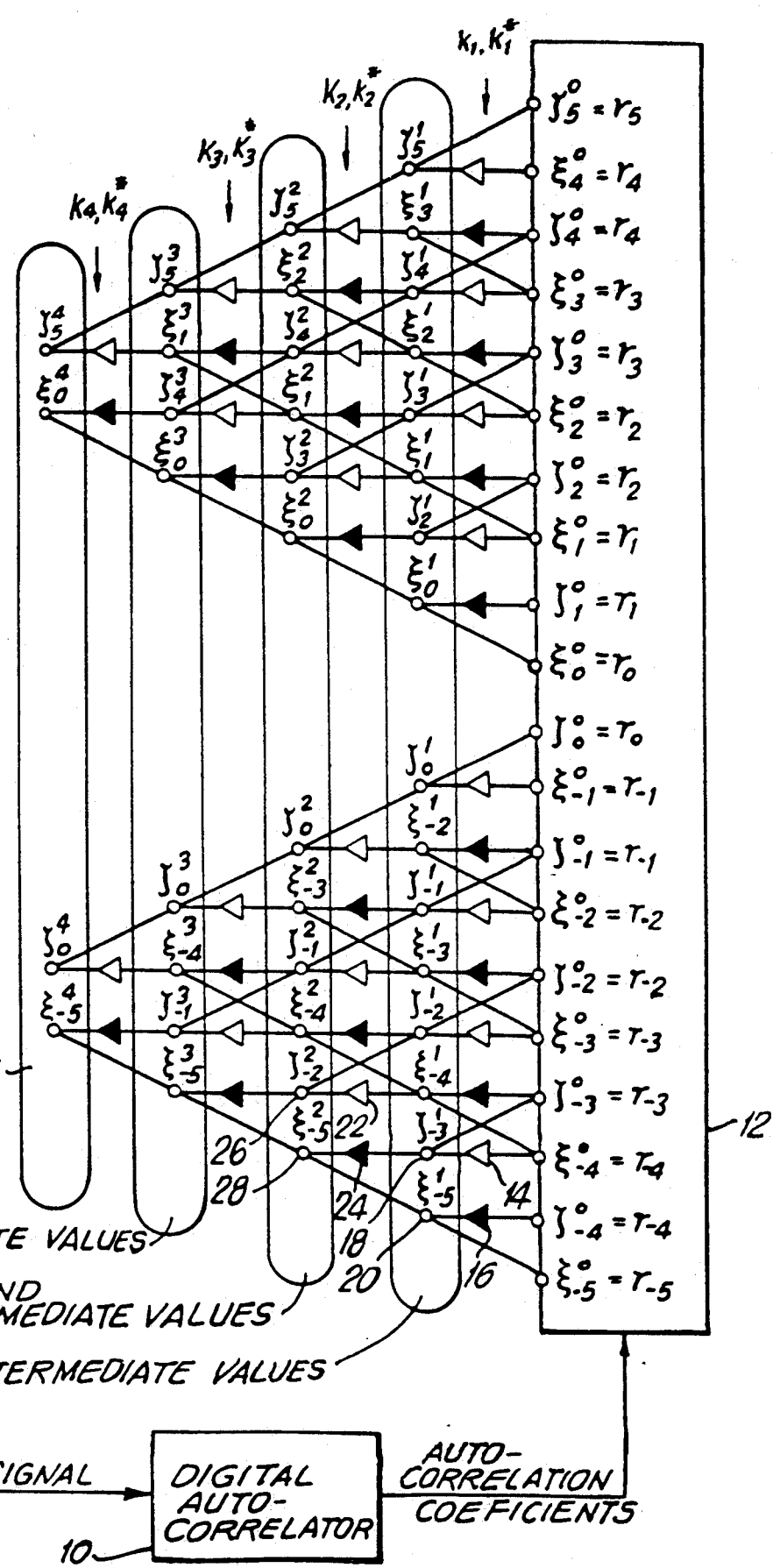
FIG. 1 illustrates the "superlattice" processing structure, for the non-symmetrical case, in accordance with the inventions of applications Ser. Nos. 837,260 and 904,382.

With reference to FIG. 1, there is shown a "superlattice" structure of multipliers, designated by triangles, and adders, designated by circles, arranged in a manner to process a signal in order to produce a linear predictor for a non-symmetrical system. This superlattice structure forms the basis for the LS-FIR processor processor of the present invention.

As shown in the figure, a signal from a system having order P, such as a communications channel, for example, is applied to a well known digital autocorrelator 10, which produces autocorrelation coefficients $r_{-5}$ through $r_5$. The autocorrelation coefficients are delivered to an input device 12, such as a digital register, or buffer memory, for application to the superlattice structure. With the exception of autocorrelation coefficients $r_{-5}$, $r_0$ and $r_5$, each autocorrelation coefficient is applied to a pair of multipliers which function to multiply each coefficient by a pair of "lattice predictor coefficients" $k_n$ and $k_n{}^*$, $k_n$ being the "normal" lattice predictor coefficient, and $k_n{}^*$ being the "adjoint" lattice predictor coefficient. The multipliers indicated by white triangles function to multiply the autocorrelation coefficients by the normal lattice predictor coefficient $k_n$, while the multipliers indicated by the black triangles function to multiply the autocorrelation coefficients by the adjoint lattice predictor coefficients $k_n{}^*$. Production of the normal and adjoint lattice predictor coefficients will be described below.

The two products produced by multiplying each autocorrelation coefficient by the normal and adjoint lattice predictor coefficients are added, in the adders indicated by the circles in the figure, to an adjacent pair of autocorrelation coefficients, to produce a set of first intermediate values $\zeta_n{}^1$, where n = -3, -2, -1, 0, 2, 3, 4, 5, and $\xi_m{}^1$, where m = -5, -4, -3, -2, 0, 1, 2, 3. For example, the autocorrelation coefficient $r_{-4}$, is multiplied by $k_1$ and $k_1{}^*$ in multipliers 14 and 16, respectively, and the products are added to the pair of autocorrelation coefficients $r_{-3}$ and $r_{-5}$, which are adjacent to coefficient $r_{-4}$, in adders 18 and 20, respectively. Similarly, autocorrelation coefficient $r_{-3}$, after multiplication by lattice predictor coefficients $k_1$ and $k_1{}^*$, is individually added to the adjacent pair autocorrelation coefficients $r_{-4}$ and $r_{-2}$. The same process takes place for autocorrelation coefficients $r_{-2}$ through $r_4$, to produce the set of first intermediate values, as shown.

For the sake of continuity, the autocorrelation coefficients $r_{-5}$ through $r_5$, are also designated as $\zeta_n{}^0$ and $\xi_m{}^0$ where n = -4 to 5 and m = -5 to 4.

The lattice predictor coefficients are calculated as follows:

$$k_{m+1} = -\zeta_{m+1}{}^m / \zeta_0{}^m$$

$$k^*{}_{m+1} = -\xi_{m+1}{}^m / \xi_0{}^m$$

The lattice predictor coefficients $k_1$ and $k_1{}^*$ are produced directly from the autocorrelation coefficients, while the second set of lattice predictor coefficients, $k_2$ and $k_2{}^*$, are calculated from the first intermediate values.

In a manner similar to that performed to generate the first intermediate values, selected pairs of adjacent first intermediate values, for example, $\xi_{-4}{}^1$ and $\zeta_{-3}{}^1$ are multiplied by the normal and adjoint lattice predictor coefficients $k_2$ and $k_2{}^*$, respectively, in multipliers 22 and 24. Two first intermediate values $\zeta_{-2}{}^1$ and $\xi_{-5}{}^1$ adjacent to, and on either side of the selected pair, are added to the products produced by multipliers 22 and 24 in adders 26 and 28, respectively, to produce two second intermediate values $\zeta_{-2}{}^2$ and $\xi_{-5}{}^2$. The remaining second intermediate values are generated in a similar manner, namely, by multiplying a selected pair of adjacent first intermediate values by the normal and adjoint lattice predictor coefficients $k_2$ and $k_2{}^*$, and by adding to the products, the first intermediate values adjacent to, and on either side of, the selected pair.

It will also be seen that, following this signal flow, the third intermediate values and final intermediate values are generated in a similar manner.

The lattice predictor coefficients $k_i$ completely characterize the linear predictor and can be used instead of the direct predictor coefficients. In fact, they are preferred for storage, transmission and fast speech synthesis, since they have the considerable advantages of being ordered, bounded by unity and can readily be used for stability control, efficient quantization, and the like. Since $r_0$ corresponds to the energy of the signal, and will therefore have the greatest amplitude of any of the signals processed by the superlattice, all variables can be normalized with respect to $r_0$, thus facilitating the use of "fixed point" processing with its attendant advantages of precision, speed, and processing simplicity.

The arrangement shown in FIG. 1 can produce lattice coefficients for a system of the type $Ra = -d$, where R has a Toeplitz structure. A detailed analysis of this technique is given by G. Carayannis et al., "A New Look on the Parallel Implementation of the Schur Algorithm for the Solution of Toeplitz Equations", *IEEE International Conference on Acoustics, Speech and Signal Processing*, Mar. 26-29, 1985, the entire disclosure of which is hereby incorporated by reference.

Figure 2:
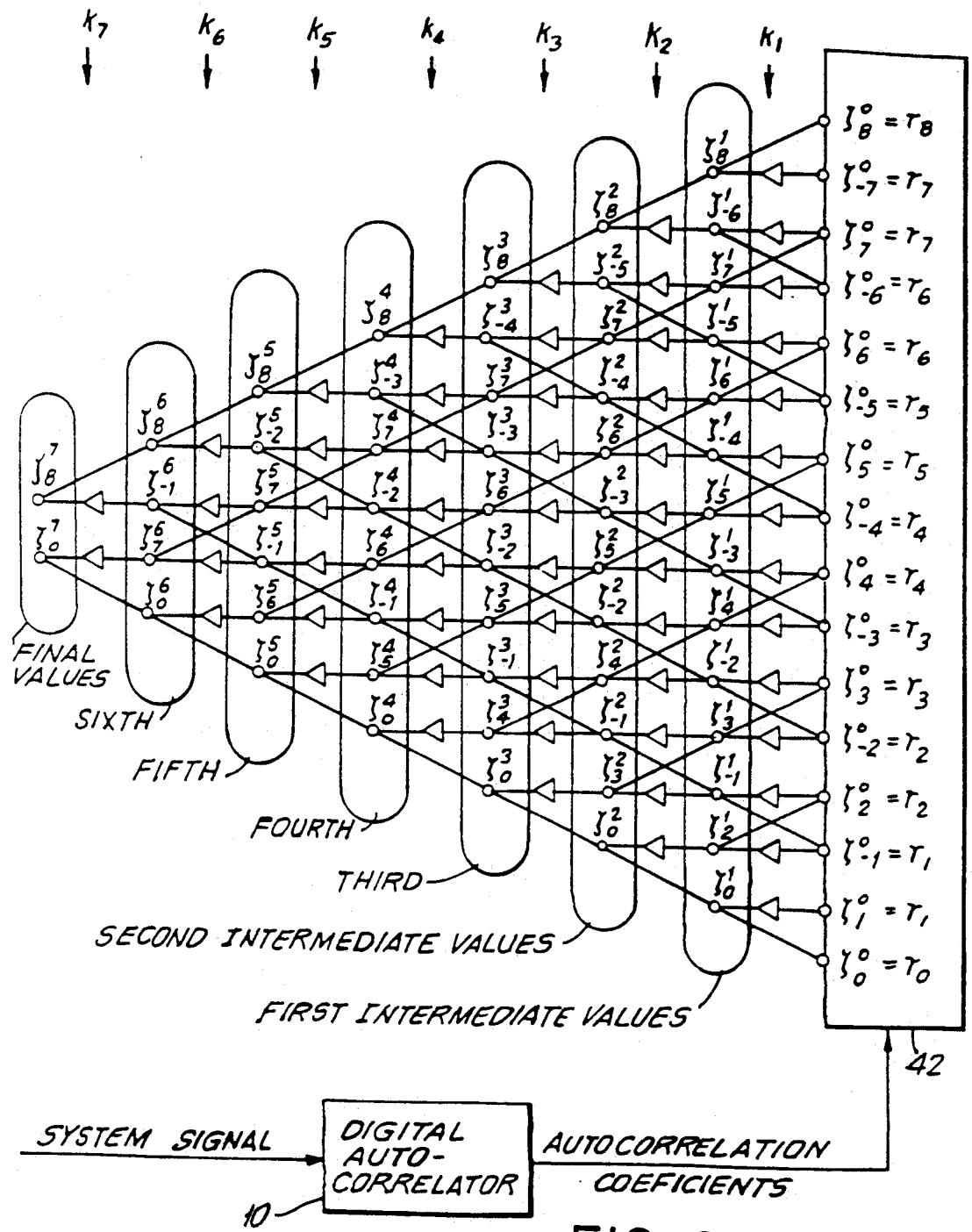
FIG. 2 illustrates the "superlattice" processing structure for the symmetrical case, in accordance with the inventions of the copending applications.

Although the lattice predictor coefficients $k_i$ and $k_i^*$ are usually preferred, the direct predictor coefficients $a_i$, which are useful in spectral estimation, for example, can be derived from the lattice coefficients using the processing structure illustrated in FIG. 2 of the above-identified co-pending applications.

The Symmetrical Case

A special situation exists where the system to be analyzed can be characterized by $Ra = -d$, where R has a symmetrical Toeplitz structure, as in the case of auto-regressive linear prediction. In such cases, the superlattice structure of FIG. 1 is simplified to the symmetrical superlattice form shown in FIG. 2 herein, since $r_i = r_{-i}$, $k_i = k_i^*$ and $\zeta_i^m = \xi_{-i}^m$, for the symmetrical case. Thus, the two triangular lobes of FIG. 1 become identical, so that one of them can be omitted, allowing the elimination of half of the signal processing. The signal processing structure for the symmetrical case, shown in FIG. 2, provides linear prediction, or auto-regressive modelling, by calculating the lattice predictor coefficients, or in the symmetrical case, the "PARCOR" (partial correlation) predictor coefficients.

It should initially be noted that with this signal processing structure (as well as that shown in FIG. 1) there is no redundancy. That is, each $\zeta$ (and $\xi$) appearing in the processor is produced only once. Additionally, only those signals needed for the production of lattice predictor coefficients, or PARCORs are involved. Thus, the signal processing structures shown in FIGS. 1 and 2 represent optimal processing schemes.

In a manner similar to that shown for the non-symmetrical case of FIG. 1, a system signal is applied to a digital autocorrelator 10, which produces autocorrelation coefficients which characterize the symmetrical system, namely, $r_0$ through $r_8$. The coefficients are applied to an input device 30, such as a digital register or memory. Note that the signal processor of FIG. 2 receives a signal from a system having an order of 8, whereas the system in FIG. 1 receives a signal from a system having an order of 5.

As with the signal processor of FIG. 1, the signal processor of FIG. 2 takes each autocorrelation coefficient, except the first and last, namely $r_0$ and $r_8$, and multiplies it by the first lattice predictor coefficient $k_1$, which is calculated from $r_0$ and $r_1$ ($\zeta_0^0$, $\zeta_1^0$), according to the general formula $k_p = -\zeta_p^{p-1}/\zeta_0^{p-1}$. The product of each such multiplication is added, individually, to the adjacent two autocorrelation coefficients, to produce the first intermediate values $\zeta_n^1$, where $n = 0$, 2 to 8 and $-6$ to $-1$. For example, autocorrelation coefficient $r_1$, designated as $\zeta_1^0$ and $\zeta_{-1}^0$, for the sake of conformance with the intermediate variables, is multiplied by lattice predictor coefficient $k_1$, and autocorrelation coefficients $r_0$ and $r_2$ are added, individually, to the product, to produce a pair of first intermediate values $\zeta_0^1$ and $\zeta_2^1$, respectively. Similarly, the next two first intermediate values, namely $\zeta_{-1}^1$ and $\zeta_3^1$ are produced by multiplying autocorrelation coefficient $r_2$ by the lattice predictor coefficient $k_1$, and adding, individually, the adjacent autocorrelation coefficients, namely, $r_1$ and $r_3$ to the products.

The second intermediate values can be calculated from the first intermediate values in a similar manner. First, $k_2$ can be calculated from the ratio of $\zeta_2^1$ and $\zeta_0^1$ in accordance with the formula given above. Then, second intermediate values $\zeta_3^2$ and $\zeta_0^2$, for example, are calculated by multiplying the first intermediate values $\zeta_{-1}^1$ and $\zeta_2^1$ by the lattice predictor coefficient $k_2$, and adding the adjacent first intermediate values $\zeta_3^1$ and $\zeta_0^1$ to the products, individually. The signal processing continues until the final values $\zeta_8^7$ and $\zeta_0^7$ are obtained, from which the last lattice predictor coefficient $k_8$ can be calculated from the above formula.

The signal processor illustrated in FIGS. 1 and 2 can be implemented as described in the above-cited co-pending applications.

Optimal FIR Filtering

The "superlattice" processing described above can readily be applied to FIR filtering, where there exists a linear system to be solved of the form:

$$Rc = -d \qquad (1)$$

where R is a Toeplitz autocorrelation matrix, d is a cross-correlation vector and c is the vector of the filter coefficients, as follows:

$$R = \begin{bmatrix} r_0 & r_1 & \cdots & r_{p-1} \\ r_1 & r_0 & \cdots & r_{p-2} \\ & & \cdot & \\ & & \cdot & \\ & & \cdot & \\ r_{p-1} & & \cdots & r_0 \end{bmatrix} \qquad (2)$$

$$C^T = [c_1 \ c_2 \ \ldots \ c_p] \qquad (3)$$

$$d^T = [d_1 \ d_2 \ \ldots \ d_p] \qquad (4)$$

For purposes of simplicity, only the symmetrical case is discussed. However, an extension of the symmetrical case to the non-symmetrical case will be apparent to those skilled in the art, in view of the disclosure herein.

Since the Toeplitz autocorrelation matrix R is the same for both FIR filtering and the linear prediction cases, discussed in the above-cited copending applications, it will be appreciated that the linear prediction and FIR filtering processes are closely related. In fact, calculation of the optimal FIR filter gives, as a by-product, the optimal predictor, $a_m$. Based on the optimal predictor, the FIR filter coefficients can be computed through the use of a Levinson type recursion, as follows:

$$C_{m+1} = \begin{bmatrix} C_m \\ 0 \end{bmatrix} + k_{m+1}^c \begin{bmatrix} Ja_m \\ 1 \end{bmatrix} \quad (5)$$

where:

$$J = \begin{bmatrix} 00 \ldots 01 \\ 00 \ldots 10 \\ 10 \ldots 00 \end{bmatrix} \quad (6)$$

$$k_{m+1}^c = -\beta_m^c / \alpha_m \quad (7)$$

$$\beta_m^c = r_{0,-m}^T J c_m + d_{m+1} \quad (8)$$

$$r_{0,-m}^T = [r_1, r_2, \ldots r_m] \quad (9)$$

Let us define the following quantities:

$$\tau_i^m = d_i + C_m^T r_{i,m} \quad (10)$$

where:

$$r_{i,m}^T = [r_{i-1} r_{i-2} \ldots r_{i-m}] \quad (11)$$

This leads to the following Schur type recursion for $\tau_i^m$.

$$\tau_i^m = \tau_i^{m-1} + k_m^c \zeta_{m-i}^{m-1} \quad (12)$$

which forms the basis of the present invention.

Figure 3:
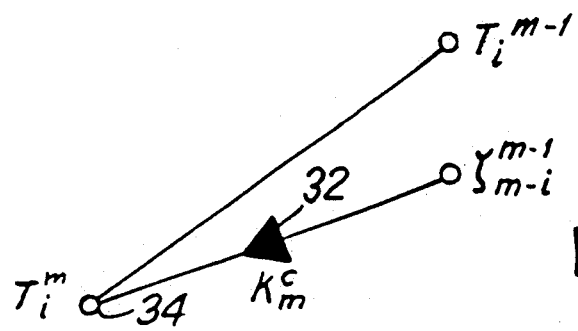
FIG. 3 illustrates the processing structure which can be used, along with the superlattice, to produce lattice filter coefficients in accordance with the present invention.

FIG. 3 is an illustration of the processing structure which can be used to compute the values $\tau_i^m$. Specifically, the value of $\tau_i^m$ is computed, in accordance with equation 12, above, by multiplying the value of $\zeta_{m-i}^{m-1}$ by $k_m^c$ in multiplier 32, and adding the result to $\tau_i^{m-1}$ in adder 34. An observation of the structure of FIG. 3 reveals that the values of $\tau_i^m$, having order m, can be computed from the values of $\tau_i^{m-1}$ and $\zeta_{m-i}^{m-1}$ having order m−1, the structure being "recursive" in nature. Also, recalling that in the case of the linear prediction processor illustrated in FIG. 2, the equivalent of equation 12 above, is:

$$\zeta_i^m = \zeta_i^{m-1} + k_m \zeta_{m-i}^{m-1} \quad (13)$$

The similarity between equations 12 and 13 is an indication that the superlattice computations, for linear prediction processing, are necessary in order to compute the $\tau_i^m$ quantities required for FIR processing. In equation 7:

$$\beta_m^c = \tau_{m+1}^m$$

Consequently, the computation of $k_{m+1}^c$, for an optimal FIR filter, needs the superlattice generally illustrated in FIG. 2 and a processing structure attached to the superlattice for recursively computing the quantities $\tau_i^m$. This structure will be called the "superladder" and is illustrated in bold lines superimposed on the superlattice, in FIG. 4. The entire structure, which can be used to produce the lattice filter coefficients $k_m^c$ and the lattice predictor coefficients $k_m$, will be referred to as the "superlattice-superladder."

Figure 4:
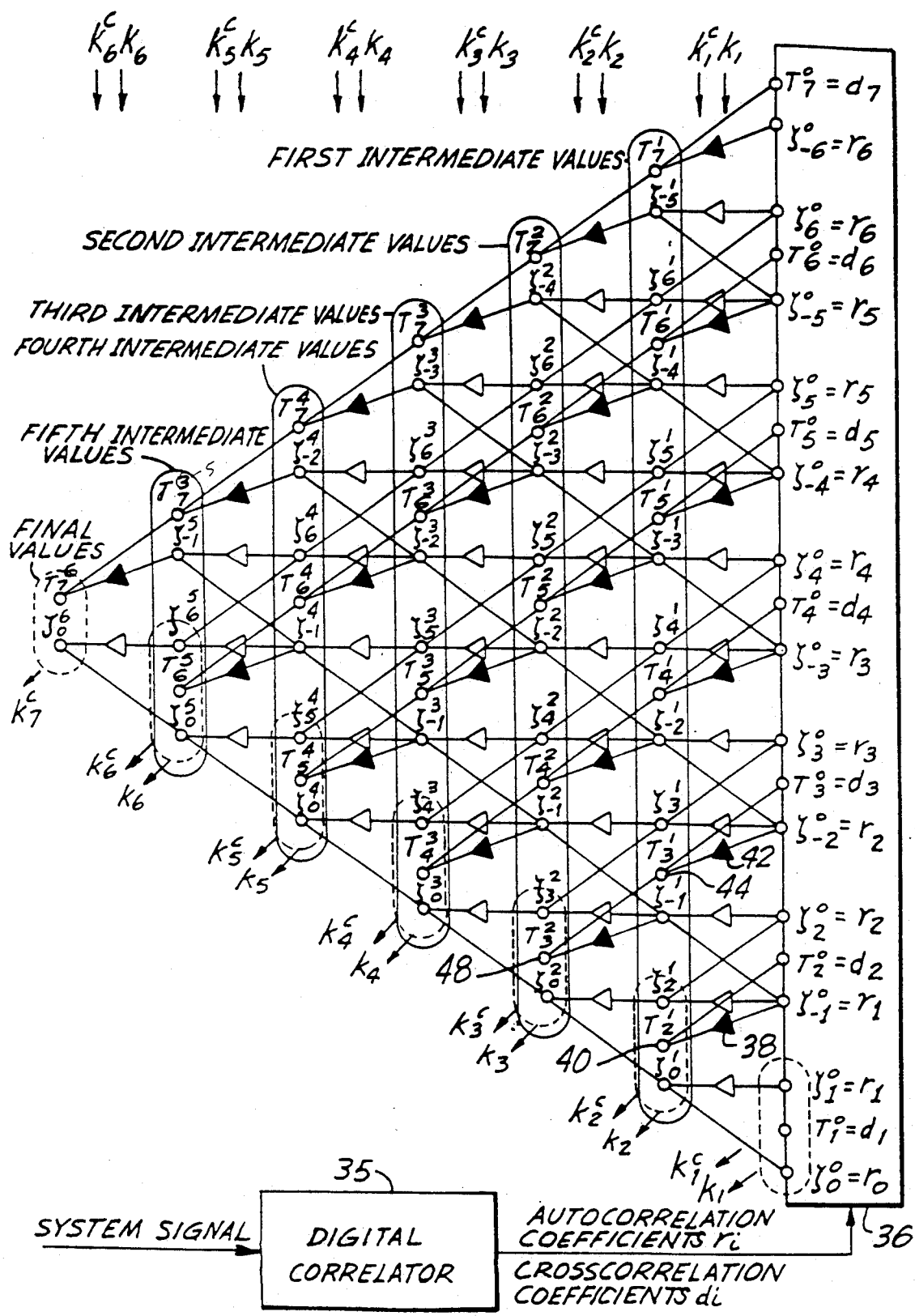
FIG. 4 illustrates the "superlattice-superladder" processing structure for producing both lattice filter coefficients $k_m{}^c$ and lattice predictor coefficients $k_m$, in accordance with the present invention.

In FIG. 4, a system signal, such as that from a communications channel, is applied to a digital correlator 35, of well known construction. The digital correlator 35 produces autocorrelation coefficients $r_0$–$r_6$ and crosscorrelation coefficients $d_1$–$d_7$ and applies them to an input device 36, such as a digital register, or buffer memory. The autocorrelation coefficients $r_0$–$r_6$ are processed using the superlattice, as shown and described with reference to FIG. 2, to produce lattice predictor coefficients $k_1$–$k_6$, and the crosscorrelation coefficients $d_1$–$d_7$ are processed, along with the autocorrelation coefficients, to produce the lattice filter coefficients $k_1^c$–$k_7^c$ using the superlattice-superladder processing structure.

As in the case of the processing structure of FIG. 2, the triangles illustrated in FIG. 4 represent multipliers and the circles represent adders. In FIG. 4, the multipliers indicated by white triangles function to multiply the respective quantities by the lattice predictor coefficients $k_m$, while the multipliers indicated by the black triangles function to multiply the respective values by the lattice filter coefficients $k_m^c$. Specifically, autocorrelation coefficient $r_1$ (also shown as $\zeta_1^0$ and $\zeta_{-1}^0$ for the sake of continuity with the intermediate values) is multiplied in multiplier 38 by the first lattice filter coefficient $k_1^c$ which is calculated in accordance with the following general formula, similar to that for the lattice predictor coefficients:

$$k_m^c = -\tau_i^{m-1}/\zeta_0^{m-1} \quad (14)$$

The product of $r_1$ and $k_1^c$ is added, in adder 40, to autocorrelation coefficient $d_2$ (also referred to as $\tau_2^0$ for the sake of continuity with the intermediate values) to produce first intermediate value $\tau_2^1$. Similarly, autocorrelation coefficient $r_2$ is multiplied by lattice filter coefficient $k_1^c$ in multiplier 42 and the result is added to crosscorrelation coefficient $d_3$ in adder 44 to yield first intermediate value $\tau_3^1$. The remaining auto and cross-correlation coefficients are processed by the superladder in a similar manner, as shown, to produce the remaining first intermediate values $\tau_4^1$–$\tau_7^1$. Of course, the superlattice, concurrently processes the autocorrelation coefficients $r_0$–$r_6$ to produce first intermediate values $\zeta_n^1$, n=0, 2, −1, 3, −2, 4, −3, 5, −4, 6, −5 as described above with reference to FIG. 2.

Continuing as shown in FIG. 4, first intermediate value $\zeta_{-1}^1$, produced by the superlattice-superladder, is multiplied, in multiplier 46, by lattice filter coefficient $k_2^c$, produced in accordance with equation 14, and the result is added to the first intermediate value $\tau_3^1$ in adder 48 to yield a second intermediate value, $\tau_3^2$. The processing involved in the production of the remaining values of $\tau$ will be apparent to those skilled in the art.

It will also be appreciated that there is no redundancy in deriving the intermediate values, $\tau_i^m$, in that each intermediate value of $\tau$ is derived only a single time, in a manner analogous to the non-redundant derivation of the intermediate values $\zeta_i^m$ using the superlattice. Thus, the processing structure illustrated in FIG. 4 represents an optimal structure for deriving both lattice filter coefficients $k_m^c$ and lattice predictor coefficients $k_m$.

As in the case of the superlattice, the superlattice-superladder can be implemented (1) in a purely sequential, order recursive manner, (2) in a fully parallel manner, or (3) in a "partitioned" parallel manner.

Figure 5A:
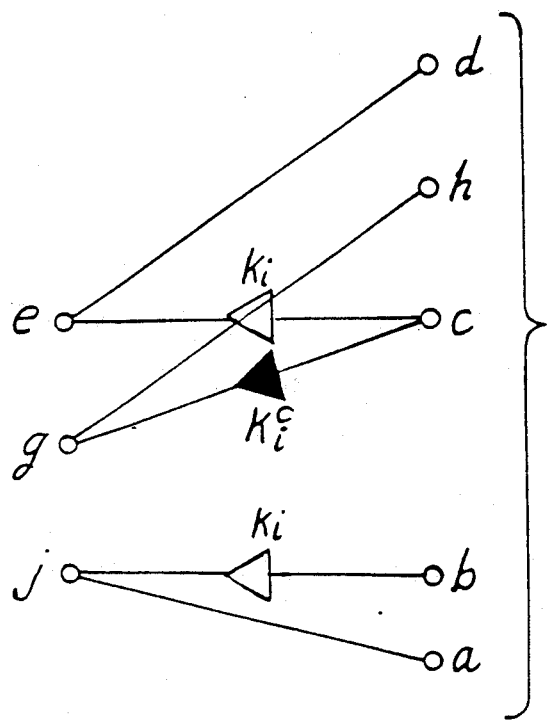
FIGS. 5a and 5b respectively illustrate the "ladder butterfly basic cell" (LBBC) and the "ladder lattice basic cell" (LLBC), in accordance with the present invention.
Figure 5B:
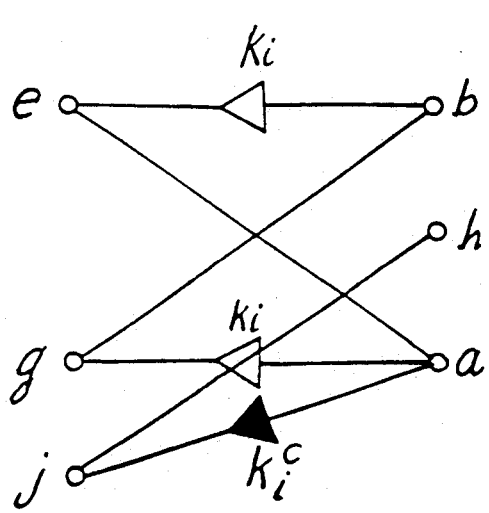

FIGS. 5a and 5b illustrate basic cells which can be used to implement the superlattice-superladder processing structure of FIG. 4, in any of the above ways. FIG. 5a illustrates a basic cell based on the "butterfly basic cell", or "BBC" structure as disclosed in the co-pending application Ser. No. 837,260, and is hereinafter referred to as the "ladder butterfly basic cell" or "LBBC". The basic cell shown in FIG. 5b is based on the "lattice basic cell" or "LBC" structure disclosed in copending application Ser. No. 904,382 and is hereinafter referred to as the "ladder lattice basic cell" or "LLBC".

With reference to FIG. 5a, the LBBC receives seven generalized quantities a, b, c, d and h, corresponding to correlation coefficients or intermediate values, and $k_i$ and $k_i^c$, corresponding to lattice predictor and filter coefficients, respectively. Based on these inputs, the LBBC produces three quantities, corresponding to intermediate or final values, e, g and j, as follows:

$$e = d + k_i c \quad (15)$$

$$g = h + k_i^c c \quad (16)$$

$$j = a + k_i b \quad (17)$$

With reference to FIG. 5b, the LLBC receives five generalized quantities a, b and h, corresponding to correlation coefficients or intermediate values, and $k_i$ and $k_i^c$, corresponding to lattice predictor and filter coefficients, respectively. Based on these inputs, the LLBC produces three quantities, corresponding to intermediate or final values, e, g and j, as follows:

$$e = a + k_i b \quad (18)$$

$$g = b + k_i a \quad (19)$$

$$j = h + k_i^c a \quad (20)$$

It will appreciated that either the LBBC or LLBC could be used to implement the structure of FIG. 4, but for the sake of simplicity, only the LLBC will be treated in detail below. However, the implementation using the LBBC is a straightforward application of the BBC implementation disclosed in copending application Ser. No. 837,260, and together with that disclosure and the discussion below, the LBBC implementation will be readily apparent to those skilled in the art.

Figure 6:
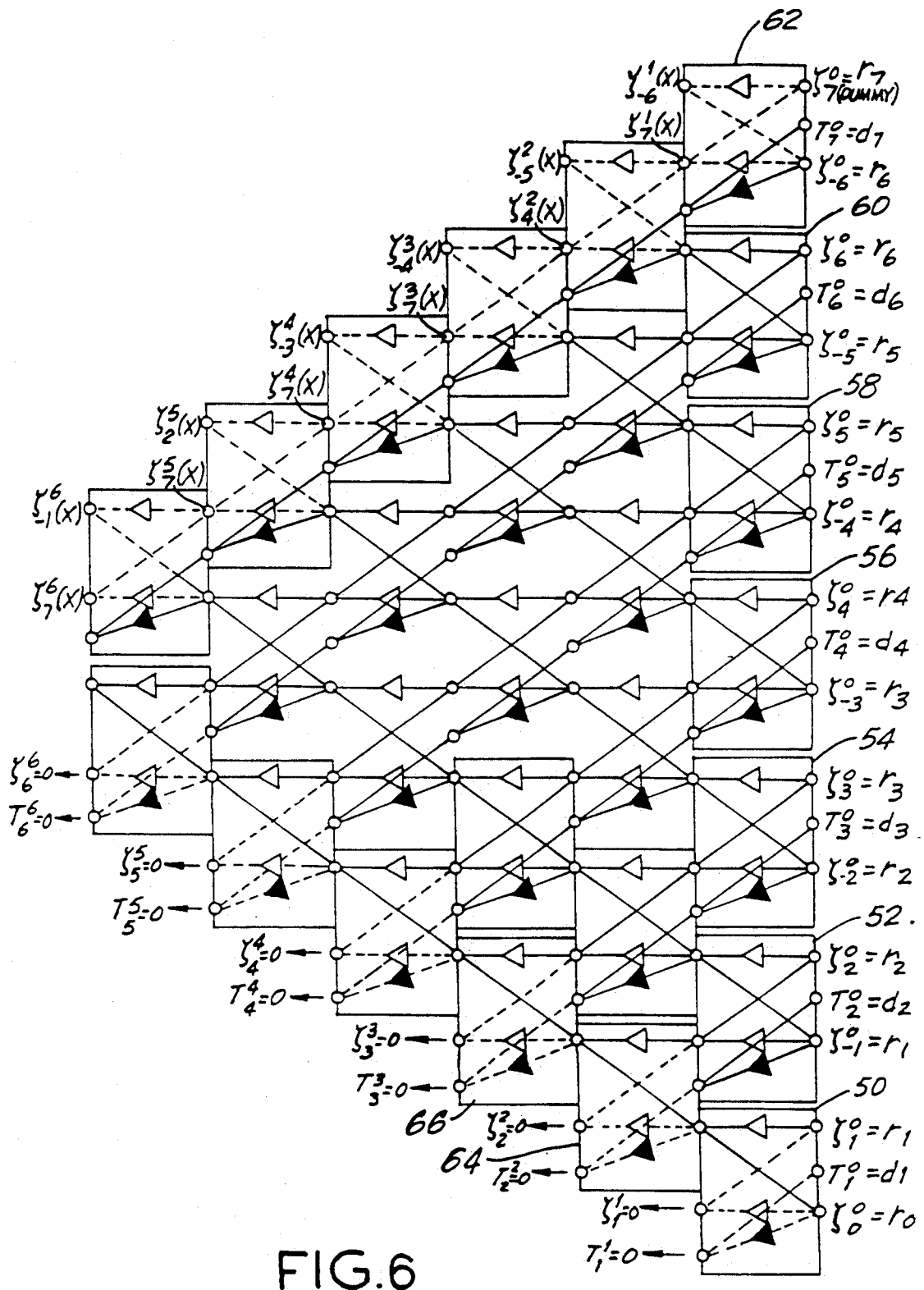
FIG. 6 illustrates the signal processing structure which is produced through the repeated use of the LLBC of FIG. 5b, in accordance with the present invention.

FIG. 6 illustrates the superlattice-superladder structure, for processing a signal from a system having order 7, when the LLBC of FIG. 5b is employed as the basic building block. Shown in dashed lines are extensions to the superladder and superlattice which result from the structure of the LLBC. The lower edge extensions, indicated by the dashed lines, function to produce intermediate values $\zeta_1^1$ through $\zeta_6^6$ and $\tau_1^1$ through $\tau_6^6$, each of which values is defined as zero, and the calculations therefor being unnecessary. The upper extensions to the processing structure are also unnecessary, and in fact, require the use of a suitably small "dummy" value for autocorrelation coefficient $r_7$ due to the difference between the FIR model order and the linear prediction order, as can be understood by observing equations 1 and 2, above. Thus, at the upper extension, only superladder basic cells exist. However, for the purposes of hardware homogeneity, the virtual extension of the superlattice is provided. The extension, fed by the dummy value for $r_7$, produces "don't care" values, indicated by an "X" beside the associated values.

As demonstrated by FIG. 6, the entire superlattice-superladder of FIG. 4 can be implemented through the repeated use of the LLBC of FIG. 5b, seven of which are indicated by reference numerals 50, 52, 54, 56, 58, 60 and 62, which together produce a complete set of first intermediate values. The processing structure for producing the second intermediate through final values are also provided by the LLBC "building blocks", two of which are indicated by reference numerals 64 and 66. However, it will be appreciated that, because of the recursive nature of the present invention, the hardware which implements the LLBC's 50, 52, etc., can also implement the remaining LLBC's 64, 66, and so on.

As mentioned above, implementation of the superlattice-superladder illustrated in FIG. 4, using the LLBC's or LBBC's, can be achieved in a fully parallel implementation, in an order-recursive implementation, or in a partitioned parallel implementation. A partitioned parallel implementation of the superlattice-superladder using LLBC's will now be described herein since such implementation includes elements of both the fully parallel and order recursive implementations.

Partitioned Parallel Implementation Using LLBC's

Figure 7:
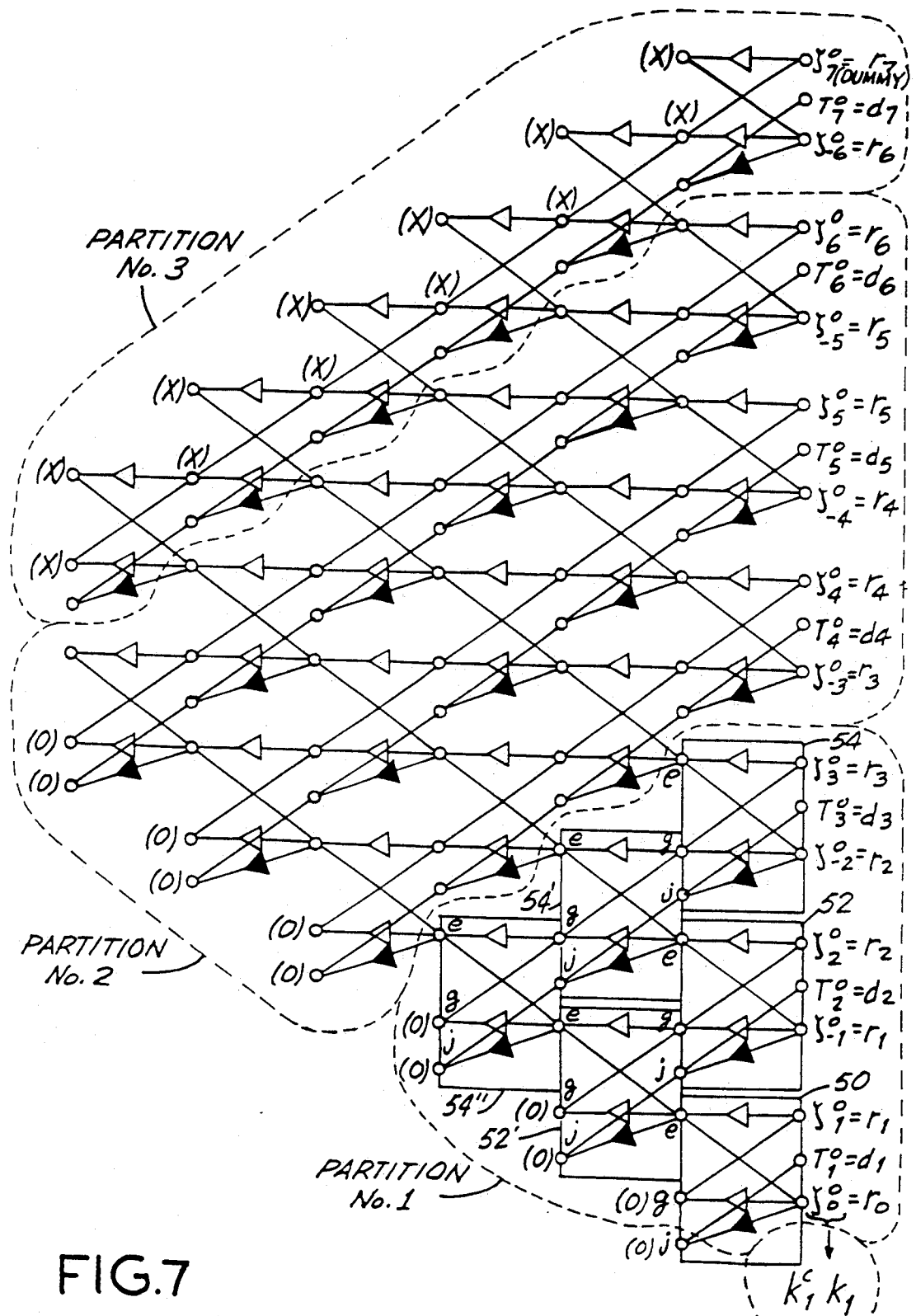
FIG. 7 illustrates the partitioned-parallel implementation of the superlattice-superladder using three LLBC's, for a system having order 7.

With reference to FIG. 7, three LLBC's 50, 52 and 54 are illustrated within a superlattice-superladder structure for processing a signal from a system having order 7. Autocorrelation coefficients $r_0$ and $r_1$, and cross-correlation coefficient $d_1$, are applied to LLBC 50; autocorrelation coefficients $r_1$ and $r_2$, and cross-correlation coefficient $d_2$ are applied to LLBC 52, and autocorrelation coefficients $r_2$ and $r_3$, and cross-correlation coefficient $d_3$ are applied to LLBC 54, as shown. Also applied to each of the LLBC's 50, 52 and 54 are lattice predictor and filter coefficients $k_1$ and $k_1^c$, respectively, which are calculated from the values of $r_0$, $r_1$ and $d_1$ in accordance with the equations given above. Each of the LLBC's produces three outputs e, g and j in accordance with FIG. 5b and the generalized equations 18–20, above. The quantities g and j produced by LLBC 50 correspond to $\zeta_1^1$ and $\tau_1^1$, respectively, as shown in FIG. 6, both of which are zero and can be ignored. At this point, the quantity e output from LLBC 54 is stored for later use and the quantities g and j from LLBC 54 and the quantity e from LLBC 52 are fed back to one of the LLBC's, 54, for example, and quantity g and j from LLBC 52 and quantity e from LLBC 50 are fed back to another LLBC, 52, for example, to continue the processing of the superlattice-superladder to provide partition No. 1, as shown. In order to help illustrate the signal flow, LLBC 54' represents LLBC 54 when the g and the j outputs from LLBC 54 and the e output from LLBC 52 are fed back to LLBC 54. Similarly, LLBC 52' represents LLBC 52 when the g and j outputs from LLBC 52 and the e output from LLBC 50 are fed back to LLBC 52. The inputs to LLBC 52' are also used to calculate the lattice predictor and filter coefficients $k_2$ and $k_2^c$ which are stored for later use, and also used as further inputs to LLBC's 54' and 52', and LLBC's 52' and 54' process new values of e, g, and j in accordance with equations 18–20. At this point, the quantity e from LLBC 54' is stored, and the g and the j outputs from LLBC 54', along with the e output from LLBC 52', are fed back to one of the LLBC's, 54, for example, illustrated in FIG. 7 as 54''. The inputs to LLBC 54'' are also used to calculate the coefficients $k_3$ and $k_3^c$ which are stored and used in LLBC 54''. LLBC 54'' functions to process the inputs to produce a new set of e, g and j values; which values are used to produce new coefficients $k_4$ and $k_4^c$. These values are stored along with the e output of LLBC 54'' for later use.

It will thus be appreciated that partition No. 1 is implemented using three LLBC's 50, 52 and 54, which function to cut through the superlattice-superladder as shown. After partition No. 1 has been processed, the autocorrelation coefficients $r_3$–$r_6$, and cross-correlation coefficients $d_4$–$d_6$ are applied to the LLBC's 50, 52 and 54, along with the stored values of $k_1$–$k_4$ and $k^c_1$–$k^c_4$ and the values of e output from LLBC 54 (54' and 54''), to process the signal through partition No. 2, in a like manner.

Finally, after the processing of partition No. 2, a single LLBC is used to implement partition No. 3, in order to finish the processing of the superlattice-superladder. Due to the edge extensions that exist along the upper part of the superlattice-superladder, in the case of FIG. 7, only superladder basic cells exist, the superlattice values being "don't cares".

It will be appreciated that the parallel partitioned implementation of the superlattice-superladder involves both the parallel processing of three LLBC's within partition Nos. 1 and 2, and sequential signal processing insofar as partition No. 3 follows in time the processing of partition No. 2, which in turn follows the processing of partition No. 1. Thus, the group of LLBC's 50, 52 and 54 function to operate in parallel, to cut through the superlattice-superladder structure sequentially in three partitions.

It should be noted that by using LLBC's to form the superlattice-superladder, the size of the bordering buffer (which stores the quantities e, from partition to partition) remains the same as compared to the use of the superlattice, without the superladder.

Figure 8:
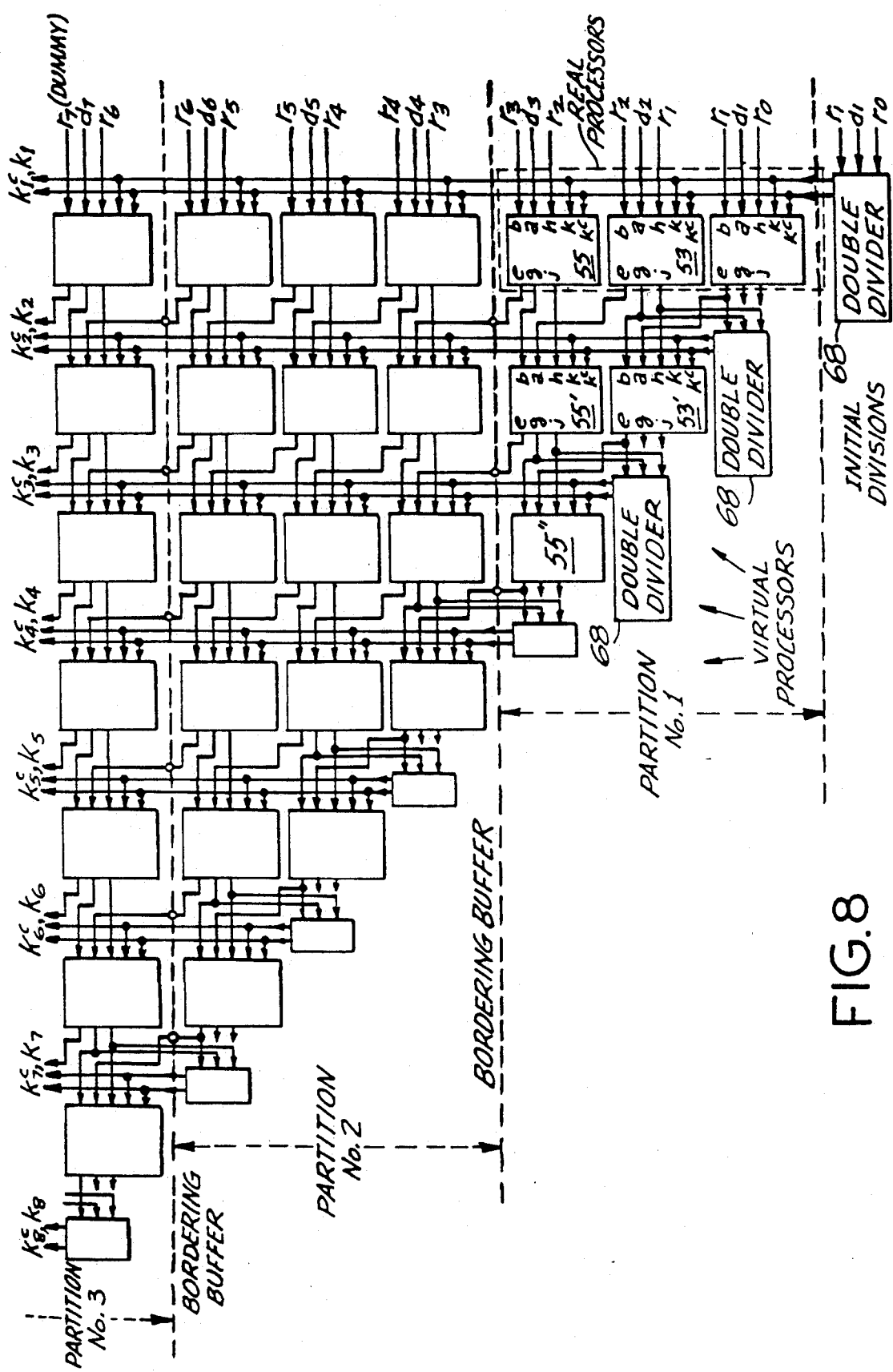
FIG. 8 illustrates the signal flow through real and virtual processors which implement the arrangement of FIG. 7.
Figure 9:
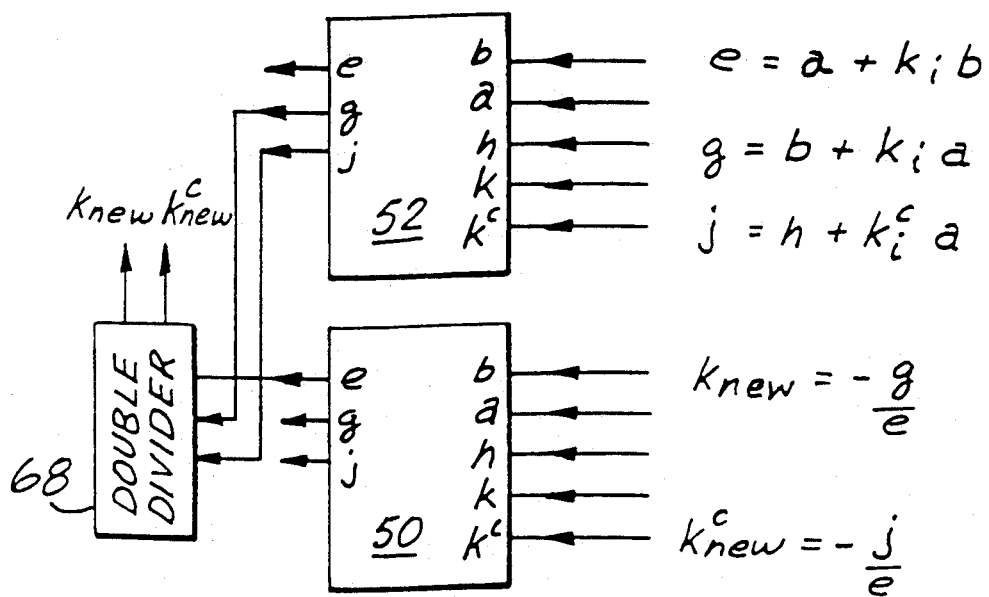
FIG. 9 illustrates the processing functions of the LLBC's and double dividers of FIG. 8.

FIG. 8 illustrates the signal flow through "real" and "virtual" processors organized to provide the partitioned parallel implementation of the superlattice-superladder. Three processors 51, 53 and 55 are provided, corresponding to LLBC's 50, 52 and 54 in FIG. 7, each implementing the functions of an LLBC, illustrated in FIG. 5b, and containing additional logic, registers, and the like. Also included are a plurality of double dividers 68 which function to produce the lattice predictor and lattice filter coefficients. FIG. 9 illustrates in detail the processing which is performed by a pair of processors, for example, 50 and 52, and the associated double divider 68, in accordance with the equations discussed above.

Returning to FIG. 8, the signals produced by the real processors 51, 53 and 55 are fed back to the real processors in order to implement the processing of the superlattice-superladder, and in doing so perform the functions of the virtual processors as well. In other words, virtual processor 53' does not exist in the location as shown, but is rather implemented by real processor 53 which receives at its inputs the prior outputs of the real processors. The existence of the virtual processors is simulated, in order to process an input signal in accordance with the superlattice-superladder structure of FIG. 7.

At each processing iteration, the e output produced by the upper processor 55 must be stored in the bordering buffer, as shown in FIG. 8 by dashed lines. As mentioned above, applying the superladder to the superlattice does not increase the size of the bordering buffer over that of the superlattice alone.

It should be noted that while the lattice predictor coefficients $k_i$ are bounded by unity, and can be normalized with respect to $r_0$, no bounds have yet been found for the lattice filter coefficients $k_1^c$. Consequently, larger word lengths are expected for the FIR computations and the logic used to handle these quantities should reflect the larger word lengths. These lengths are problem dependent, and can be found experimentally as will be appreciated by those skilled in the art.

Also, in contrast to the LBC's or BBC's described in the above cited copending applications, the LLBC's and LBBC's of the present invention each require three multiplications and three additions, as set forth in FIGS. 5a and 5b. Thus, the LLBC's and LBBC's may be realized using either three single-cycled processing elements, or a single three-cycled processing element, depending upon the requirements of speed and hardware complexity.

Figure 10:
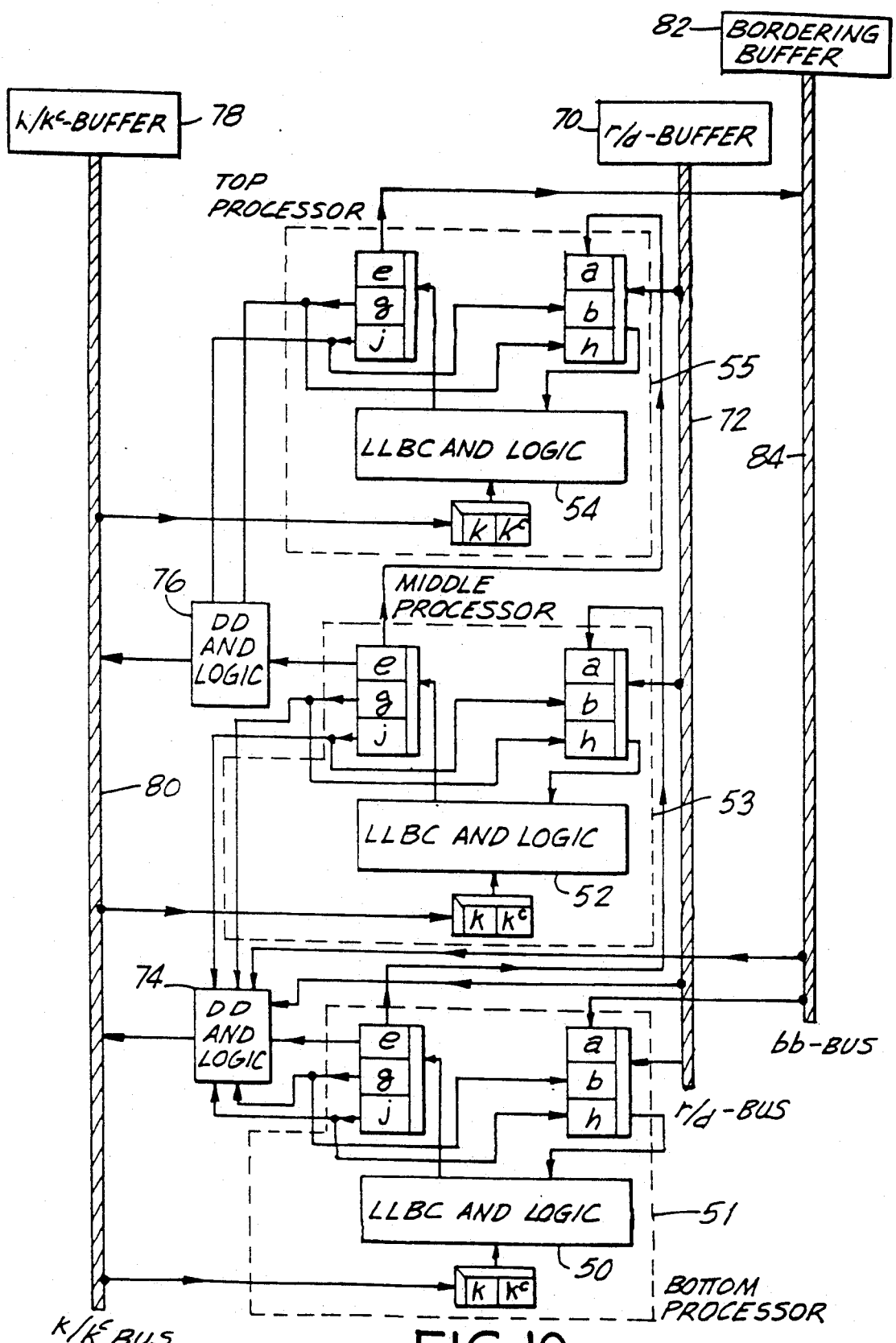
FIG. 10 illustrates the hardware implementation of the arrangement shown in FIGS. 7 and 8, in accordance with the present invention, showing three LLBC's and associated hardware.

FIG. 10 illustrates an example of a hardware implementation for providing the parallel-partitioned processing of the superlattice-superladder using three LLBC's. The parallel processors 51, 53 and 55 are shown as including the LLBC's 50, 52 and 54 of FIG. 7, respectively, and associated logic. Each processor also includes an a, b, h register and an e, g, j register which function to individually store the values a, b, h and e, g, j associated with each basic cell (as illustrated in FIG. 5b) and a k,$k^c$ register which stores the values of the lattice predictor and filter coefficients.

Each of the a, b, h registers receives the appropriate auto and cross-correlation coefficients from the r/d buffer 70, via r/d bus 72. The r/d buffer 70 also directly provides the first three auto and cross correlation coefficients $r_0$, $r_1$ and $d_1$ to double divider and associated logic 74, which accordingly calculates the initial lattice predictor and filter coefficients $k_1$ and $k_1^c$. The outputs from double divider 74 and another double divider and associated logic 76 are applied to the k/$k^c$ buffer 78, via the k/$k^c$ bus 80. The k/$k^c$ buffer 78 provides each of the k/$k^c$ registers in each of the processors with the lattice coefficients via the k/$k^c$ bus 80. The outputs of the a, b, h register and the k/$k^c$ register in each processor are connected to their associated LLBC's, and the outputs of each LLBC are applied to its respective e, g, j register.

The outputs of the e registers in the bottom and middle processors 51 and 53 are applied to the inputs of the a registers in the middle and top processors 53 and 55, respectively, while the output of the e register in the top processor 55 is applied to the bordering buffer 82 via the bordering buffer bus 84. The outputs of the e registers in the bottom and middle processors 51 and 53 are also applied to the double dividers 74 and 76 respectively. Double divider 74 also receives inputs from the g and j registers of the middle and bottom processors 51 and 53 and also from the bordering buffer 82, via the bordering buffer bus 84. Double divider 76 receives inputs from the g and j registers of the top processor 55. Finally, the outputs of the g and j registers in each of the processors are applied to the inputs of the b and h registers respectively, within each associated processor.

The operation of the hardware shown in FIG. 10 to produce the superlattice-superladder processing structure illustrated in FIGS. 7 and 8 and will now be described:

Phase 0 Initial Divisions ($k_1$/$k^c$ computation storage, transmission):

The double (possibly two-cycled) divider 74 attached to the bottom processor 51 accept the first two autocorrelation coefficients and the first cross-correlation coefficient from the r/d-buffer 70 and produces $k_1$ and $k_1^c$. All other elements are idle. $k_1$ and $k_1^c$ are stored in the k/$k^c$-buffer 78 and transmitted to the k and $k^c$ registers of each processor through the k/$k^c$-bus 80.

Phase 1 Initialization of Partition 1:

The a, b, h registers of all processors are initialized through the r/d-bus 72 with the proper auto/cross-correlation coefficients.

Phase 2 LLBC computations:

The LLBC's of all processors compute intermediate values and store them in the e, g, j registers of each processor.

Phase 3 $k_2/k_2^c$ computation-storage-transmission:

The divider attached to the bottom processor computes $k_2$ from the e register of the bottom processor and the g register of the middle processor 53 and $k_2^c$ from the e register of the bottom processor and the j register of the middle processor. $k_2$ and $k_2^c$ are stored in the k/k-buffer 78 and transmitted to the k and $k^c$ registers of each processor through the k/$k^c$ bus 80.

Phase 4 Initialization of the a, b, h registers of each processor, update of the bordering buffer:

The following transfers take place:

| | | |
|---|---|---|
| e of the bottom processor | → | a of the middle processor |
| e of the middle processor | → | a of the top processor |
| e of the top processor | → | bordering buffer |
| g of the middle processor | → | b of the middle processor |
| g of the top processor | → | b of the top processor |
| j of the middle processor | → | h of the middle processor |
| j of the top processor | → | h of the top processor |

Phase 5 LLBC computations with the bottom element idle:

The LLBC's of the middle and top processors produce intermediate values which are stored in the corresponding e, g, j registers.

Phase 6 $k_3/k_3^c$ computation-storage-transmission:

The divider 76 attached to the middle processor 53 computes $k_3$, fed by the e register of processor 53 and the g register of the top processor 55, and $k_3^c$, fed by the e register of the middle processor and the j register of the top processor. $k_3$ and $k_3^c$ are stored in the k/k-buffer and transmitted to the k and $k^c$ registers of each processor through the k/$k^c$-bus.

Phase 7 Initialization of the a, b, h registers, update of the bordering buffer:

The following transfers take place:

| | | |
|---|---|---|
| e of the middle processor | → | a of the top processor |
| e of the top processor | → | the bordering buffer |
| g of the top processor | → | b of the top processor |
| j of the top processor | → | h of the top processor |

Phase 8 Top LLBC computations with the bottom and middle processors idle:

The top LLBC 54 computes intermediate values and stores them in its e, g, j registers.

Phase 9 Bordering buffer update:

The following transfer takes place:

| | | |
|---|---|---|
| e of the top processor 55 | → | bordering buffer |

Phase 10 $k_1/k_1^c$ retransmission:

$k_1$ and $k_1^c$, which have been stored in the k/$k^c$-buffer are transmitted to the k and $k^c$ registers of all processors through the k/$k^c$-bus.

Phase 11 Initialization of Partition 2:

The a, b and h registers of all processors are initialized through the r/d-bus with the proper auto/cross-correlation coefficients.

Phase 12 LLBC Computations:

The LLBC's of all processors compute intermediate values and store them in the e, g and j registers of each processor.

Phase 13

Initialization of the a, b and h registers,
update of the bordering buffer and
$k_2/k_2^c$ retransmission:

The following transfers take place: The a register of the bottom processor is initialized from the bordering buffer.

$k_2$ and $k_2^c$ are retransmitted to the k and $k^c$ registers of all processors.

| | | |
|---|---|---|
| e of the bottom processor | → | a of the middle processor |
| e of the middle processor | → | a of the top processor |
| e of the top processor | → | bordering buffer |
| g of the bottom processor | → | b of the bottom processor |
| g of the middle processor | → | b of the middle processor |
| g of the top processor | → | b of the top processor |
| j of the bottom processor | → | h of the bottom processor |
| j of the middle processor | → | h of the middle processor |
| j of the top processor | → | h of the top processor |

The a register of the bottom processor must be initialized from the bordering buffer before the contents of the latter are destroyed by the storage of the newly computed contents of e register in the top processor.

Phase 14 LLBC computations:

The same as phase 12.

Phase 15

Initialization of the a, b, h registers, update of the bordering buffer, $k_3/k_3^c$ retransmission.

The same as phase 13, but $k_3$ and $k_3^c$ are retransmitted instead of $k_2$ and $k_2^c$.

Phase 16 LLBC Computations:

The same as phase 12.

Phase 17 $k_4/k_4^c$ computation-storage-transmission:

The divider attached to the bottom processor computes $k_4$ fed by the g register of the bottom processor and a quantity from the bordering buffer, and $k_4^c$ fed by the j register of the bottom processor and the same quantity from the bordering buffer. $k_4$ and $k_4^c$ are stored in the k/$k^c$-buffer and transmitted to the k and $k^c$ registers of each processor through the $k_4^c$ bus.

Phase 18

Initialization of the a, b, h registers,
update of the Bordering Buffer:

The same as phase 13, except the $k_2/k_2^c$ retransmission.

Phase 19 LLBC Computations:

The same as phase 12.

Phase 20 $k_5/k_5^c$ computation-storage-transmission:

The same as phase 3, but $k_5$ and $k_5^c$ are computed-stored-transmitted instead of $k_2$, $k_2^c$.

Phase 21

Initialization of the a, b, h registers,
update of the bordering buffer:

The same as phase 4.

Phase 22 LLBC computation with the bottom processor idle:

The same as phase 5.

Phase 23 $k_6/k_6^c$ computation-storage-transmission:

The same as phase 6, but $k_6$ and $k_6^c$ are computed-stored-transmitted instead of $k_3$ and $k_3^c$.

Phase 24
Initialization of the a, b, h registers,
update of the bordering buffer:
The same as phase 7.
Phase 25
Top LLBC computations with the bottom and middle processors idle:
The same as phase 8.
Phase 26 Bordering buffer update:
The same as phase 9.
Phase 27 $k_1/k_1^c$ retransmission:
The same as phase 10.
Phase 28 Initialization of partition 3:
The same as phase 11.

The continuation through the third partition will be understood by those skilled in the art in view of the foregoing.

The superlattice-superladder concept is suitable for efficient hardware implementation with commercially available processors. A small number of processors, e.g. three to six, may be used for many applications with very good results and a substantial increase in processing speed over that of prior art signal processors.

It will thus be appreciated that the present invention allows the use of a feasible number of parallel processors to perform highly efficient LS-FIR signal processing. When so implemented, the parallel-partitioned implementation provides the benefits of parallel processing, manageable hardware complexity, and optimal signal processing for a given number of available processors.

Various changes and variations to the present invention will occur to those skilled in the art in view of the foregoing description. It is intended that all such changes and variations be encompassed so long as the present invention is employed, as defined by the following claims.

What is claimed is:

1. A finite impulse response filter which receives autocorrelation coefficients $r_0$-$r_{p-1}$ and crosscorrelation coefficients $d_1$-$d_p$, from a system having order p, for providing lattice filter coefficients $k_1^c$-$k_p^c$ of said system, comprising:
    a plurality of physical parallel processing units, the number of which is less than the system order P, for receiving during a first time interval autocorrelation coefficients $r_0$ through $r_n$ and crosscorrelation coefficients $d_2$-$d_n$, where n is less than the system order P and is related to the number of said physical parallel processing units, said plurality of physical parallel processing units configured to concurrently produce first intermediate values
    $\zeta_i^1 = r_i + k_1 r_{i-1}$, for i=2 through n,
    $\zeta_{-i}^1 = r_i + k_1 r_{i+1}$, for i=0 through n−1, and
    $\tau_i^1 = d_i + k_1^c r_{i-1}$, for i=2 through n;
    feedback means for applying selected ones of said first intermediate values to at least one of said physical parallel processing units, to produce at least a plurality of second intermediate values
    $\zeta_i^2 = \zeta_i^1 + k_2 \zeta_{2-i}^1$, for i=3 through n,
    $\zeta_{-i}^1 = \zeta_{-i}^1 + k_2 \zeta_{2+i}^1$, for i=0 through n−2, and
    $\tau_i^2 = \tau_i^1 + k_2^c \zeta_{2-i}^1$, for i=3 through n;
    said first and second intermediate values being produced in succession within said first time interval;
    means for applying all remaining autocorrelation and crosscorrelation coefficients to at least one of said plurality of said physical parallel processing units if the system order P is less than 2n, and otherwise applying autocorrelation coefficients $r_n$ through $r_{2n}$ and crosscorrelation coefficients $d_{n+1}$ through $d_{2n}$ to said plurality of said physical parallel processing units, to thereby produce additional first and second intermediate values during a second time interval subsequent to said first time interval; and
    divider circuitry for dividing autocorrelation coefficient $r_1$ by $r_0$ to produce $k_1$, for dividing first intermediate value $-\zeta_2^1$ by $\zeta_0^1$ to produce $k_2$, for dividing $-d_1$ by $r_0$ to produce $k_1^c$ and for dividing $-\tau_2^1$ by $\zeta_0^1$ to produce $k_2^c$.

2. The filter of claim 1 wherein said divider circuitry is contained in at least one of said plurality of physical parallel processing units, and crosscorrelation coefficient $d_1$ is applied to said at least one of said plurality of physical parallel processing units.

3. The filter of claim 1 wherein each of said processors is comprised of three single-cycled processing elements.

4. The filter of claim 1 wherein each of said processors is comprised of a single three-cycle processing element.

5. The filter of claim 1 wherein the number of said physical parallel processing units is equal to n.

6. The filter of claim 5 wherein each of said physical parallel processing units includes a ladder lattice basic cell.

7. A finite impulse response filter which receives autocorrelation coefficients $r_0$-$r_{p-1}$ and crosscorrelation coefficients $d_1$-$d_p$ from a system having order P, for providing lattice filter coefficients $k_1^c$-$k_p^c$ of said system, comprising:
    a plurality of physical parallel processing units, the number of which is less than the system order P, for receiving during a first time interval autocorrelation coefficients $r_0$ through $r_n$ and autocorrelation coefficients $d_2$-$d_n$, where n is less than the system order P and is related to the number of said physical parallel processing units, said plurality of physical parallel processing units configured to concurrently produce first intermediate values
    $\zeta_i^1 = r_i + k_1 r_{i-1}$, for i=2 through n,
    $\zeta_{-i}^1 = r_i + k_1 r_{i+1}$, for i=0 through n−2, and
    $\tau_i^1 = d_i + k_1^c r_{i-1}$, for i=2 through n;
    feedback means for applying selected ones of said first intermediate values to at least one of said physical parallel processing units, to produce at least a plurality of second intermediate values
    $\zeta_i^2 = \zeta_i^1 + k_2 \zeta_{2-i}^1$, for i=3 through n,
    $\zeta_{-i}^2 = \zeta_{-i}^1 + k_2 \zeta_{2+i}^1$, for i=0 through n−3, and
    $\tau_i^2 = \tau_i^1 + k_2^c \zeta_{2-i}^1$, for i=3 through n;
    said first and second intermediate values being produced in succession within said first time interval;
    means for applying all remaining autocorrelation and crosscorrelation coefficients to at least one of said plurality of said physical parallel processing units if the system order P is less than 2 n, and otherwise applying autocorrelation coefficients $r_{n-1}$ through $r_{2n-1}$ and cross correlation coefficients $d_{n+1}$ through $d_{2n-1}$ to said plurality of said physical parallel processing units, to thereby produce additional first and second intermediate values during a second time interval subsequent to said first time interval; and
    divider circuitry for dividing autocorrelation coefficient $r_1$ by $r_0$ to produce $k_1$, for dividing first intermediate value $-\zeta_2^1$ by $\zeta_0^1$ to produce $k_2$, for dividing $-d_1$ by $r_0$ to produce $k_1^c$ and for dividing $-\tau_2^1$ by $\zeta_0^1$ to produce $k_2^c$.

8. The filter of claim 7, wherein said divider circuitry is contained in at least one of said plurality of physical parallel processing units, and crosscorrelation coefficient $d_1$ is applied to said at least one of said plurality of physical processing units.

9. The filter of claim 7 wherein each of said processors is comprised of three single-cycled processing elements.

10. The filter of claim 7 wherein each of said processors is comprised of a single three-cycle processing element.

11. The filter of claim 7 wherein the number of said physical parallel processing units is equal to $n-1$.

12. The filter of claim 11 wherein each of said physical parallel processing units includes a ladder butterfly basic cell.

13. Apparatus for receiving autocorrelation coefficients and crosscorrelation coefficients of a system having an order, and for producing therefrom lattice filter coefficients of said system, comprising:
a plurality of processing units, the number of which is less than the order of said system, each of said processing units having input and output terminals and producing values at said output terminals as a function of values applied to said input terminals in accordance with a predefined recursion;
a buffer for applying to said input terminals of said plurality of parallel processing units less than all of said autocorrelation and crosscorrelation coefficients;
controlled feedback circuitry for feeding back selected ones of the values produced at the output terminals of said parallel processing units to selected input terminals thereof, said controlled feedback circuitry continuing said feeding back of selected outputs of said processing units to selected input terminals to thereby produce a first partition;
said buffer applying additional autocorrelation and crosscorrelation coefficients to said input terminals of at least one of said plurality of parallel processing units after said first partition is produced, and said controlled feedback circuitry thereby producing at least a second partition; and
divider circuitry for dividing selected ones of the values produced at the output terminals of said parallel processing units by other selected values produced at said output terminals to thereby produce said lattice filter coefficients.

14. The apparatus of claim 13 wherein said divider circuitry also produces lattice predictor coefficients.

15. The apparatus of claim 13 further including a storage device for storing values from at least one selected output terminal of at least one of said processing units during said first partition, said storage device providing said stored values to an input terminal of at least one said processing units during said second partition.

16. The apparatus of claim 13 wherein each of said parallel processing units includes a ladder butterfly basic cell.

17. The apparatus of claim 13 wherein each of said parallel processing units includes a ladder lattice basic cell.

18. The apparatus of claim 13 wherein controlled feedback circuitry feeds back selected ones of the values produced at the output terminals of said processing units to the input terminals of a lesser number of said processing units than the number of processing units from which said selected ones of said values were taken, and said controlled feedback circuitry continues said feeding back until said selected outputs are fed back to a single processing unit.

19. A method for producing lattice filter coefficients of a system having an order, comprising:
receiving autocorrelation and crosscorrelation coefficients of said system;
applying less than all of said autocorrelation and crosscorrelation coefficients to the input terminals of a plurality of parallel processing units, the number of which is less than the order of said system;
producing values at output terminals of said processing units as a function of values applied to said input terminals in accordance with a predefined recursion;
feeding back selected ones of the values produced at the output terminals of said parallel processing units to selected input terminals thereof;
continuing said feeding back of selected outputs to thereby produce and complete a first partition;
applying additional autocorrelation and crosscorrelation coefficients to said input terminals of at least one of said parallel processing units after said first partition is completed, to thereby produce at least a second partition; and
dividing selected ones of the values produced at the output terminals of said parallel processing units by other selected values produced at said output terminals to thereby produce said lattice filter coefficients.

20. The method of claim 19 further comprising dividing selected ones of the values produced at the output terminals of said parallel processing units by other selected values produced at said output terminals to thereby produce lattice predictor coefficients.

21. The method of claim 19 further comprising:
storing values from at least one selected output terminal of at least one of said processing units during said first partition; and
applying said stored values to an input terminal of at least one of said processing units during said second partition.

22. The method of claim 19 wherein said step of feeding back comprises:
feeding back selected ones of the values produced at the output terminals of said processing units to the input terminals of a lesser number of said processing units than the number of processing units from which said selected ones of said values were taken; and
continuing said feeding back until said selected outputs are fed back to a single processing unit.

* * * * *